(12) United States Patent  
Minich

(10) Patent No.: US 7,540,744 B1  
(45) Date of Patent: Jun. 2, 2009

(54) SHARED HOLE ORTHOGONAL FOOTPRINT WITH BACKDRILLED VIAS

(75) Inventor: Steven E. Minich, York, PA (US)

(73) Assignee: FCI Americas Technology, Inc., Carson City, NV (US)

( * ) Notice: Subject to any disclaimer, the term of this patent is extended or adjusted under 35 U.S.C. 154(b) by 0 days.

(21) Appl. No.: 11/970,804

(22) Filed: Jan. 8, 2008

(51) Int. Cl.
H01R 12/00 (2006.01)

(52) U.S. Cl. .................................................. 439/65

(58) Field of Classification Search ............ 439/63, 439/65, 79–80; 361/792–795; 174/260, 174/261

See application file for complete search history.

(56) References Cited

U.S. PATENT DOCUMENTS

| | | | |
|---|---|---|---|
| 4,472,765 A | 9/1984 | Hughes | |
| 4,686,607 A | 8/1987 | Johnson | |
| 4,900,276 A * | 2/1990 | Doutrich | 439/751 |
| 4,939,624 A * | 7/1990 | August et al. | 361/816 |
| 5,887,158 A * | 3/1999 | Sample et al. | 716/15 |
| 6,352,436 B1 * | 3/2002 | Howard | 439/82 |
| 6,392,160 B1 | 5/2002 | Andry et al. | |
| 6,608,762 B2 * | 8/2003 | Patriche | 361/788 |
| 6,663,442 B1 | 12/2003 | Helster et al. | |
| 6,986,682 B1 | 1/2006 | Jeon | |
| 7,008,272 B2 * | 3/2006 | Blossfeld | 439/751 |
| 7,052,288 B1 | 5/2006 | Minich | |
| 7,057,115 B2 | 6/2006 | Clink et al. | |
| 7,096,555 B2 * | 8/2006 | Tourne et al. | 29/402.06 |
| 7,422,484 B2 | 9/2008 | Cohen et al. | |
| 2002/0181217 A1 * | 12/2002 | Patriche | 361/796 |
| 2006/0073709 A1 * | 4/2006 | Reid | 439/65 |
| 2006/0199390 A1 | 9/2006 | Dudnikov, Jr. et al. | |
| 2006/0228912 A1 | 10/2006 | Morlion et al. | |
| 2008/0026611 A1 * | 1/2008 | Kanesashi | 439/78 |

OTHER PUBLICATIONS

U.S. Appl. No. 60/986,223, filed Nov. 7, 2007, Johnescu, Douglas.

\* cited by examiner

*Primary Examiner*—T C Patel
*Assistant Examiner*—Harshad C Patel
(74) *Attorney, Agent, or Firm*—Woodcock Washburn LLP

(57) ABSTRACT

In an electrical system, such as an orthogonal, midplane architecture, backdrilling vias may enable selective connectivity to components of the midplane board without custom connectors and/or contacts. A first contact and a second contact may be received within a shared backdrilled via at opposite ends. The backdrilled via may establish electrical connectivity between the first contact and an internal conductive path of a midplane board. Because the backdrilling removes a portion of the via, the first contact and the second contact may be electrically isolated. The electrically conductive path between the first mounting contact and the internal conductive layer may be used for low-speed communications channel, power, ground, control signaling, or the like.

22 Claims, 4 Drawing Sheets

```
┌─────────────────────────────────────┐
│ Defining an electrical connector footprint │
└─────────────────────────────────────┘
              │ ~402
              ▼
┌─────────────────────────────────────┐
│ Providing a first header connector and a │
│     second header connector         │
└─────────────────────────────────────┘
              │ ~404
              ▼
┌─────────────────────────────────────┐
│ Preparing a substrate according to the footprint │
└─────────────────────────────────────┘
              │ ~406
              ▼
┌─────────────────────────────────────┐
│         Backdrilling a via hole     │
└─────────────────────────────────────┘
              │ ~408
              ▼
┌─────────────────────────────────────┐
│ Mounting the first header connector and the │
│ second header connector to the substrate │
│       consistent with the footprint │
└─────────────────────────────────────┘
                ~410
```

*FIG. 4*

SHARED HOLE ORTHOGONAL FOOTPRINT WITH BACKDRILLED VIAS

BACKGROUND

An electronic system may include interconnected circuit boards, such as daughter boards, motherboards, backplane boards, midplane boards, or the like. The circuit boards may be interconnected with one or more connector assemblies. A typical connector assembly for a midplane board may include two header connectors, each attached to opposite sides of the midplane board. The two daughter boards that interconnect with the midplane board each may have a complementary connector that mates with the respective header connector. Typically, the connectors are part of a connector family, manufactured according to an established format.

The header connectors each may have a respective mounting contact. The circuit board may have one or more holes or "vias" that receive the mounting contacts. In some applications, the mounting contacts extend into the same via from either side of the circuit board. The via may be plated to provide electrical conductivity between the respective mounting contacts, and thus, between the respective daughter boards.

Multilayer circuit boards may have a number of conductive signal layers insulated from each other by dielectric layers. The conductive signal layers may provide high density communication between components because more than one layer is available for communication between components. Because the signal layers are parallel to each other, in multilayer boards, plated vias provide a conductive path between and/or among signal layers. These paths allow for complex circuit design and flexible routing of signals from one layer to another layer.

Electronic applications may benefit from a shared via architecture and multilayer midplane boards. For example, it may be desirable to have some signal paths, such as low-speed communication paths, route from a daughter board to a signal layer of the midplane board. However, such designs may be problematic, particularly with standard connectors in an orthogonal orientation. Because the vias are typically plated from end-to-end, a shared via providing connectivity to the midplane may inherently provide an undesirable, concurrent connectivity between mounting contacts.

SUMMARY

In an electrical system, such as an orthogonal, midplane architecture, backdrilling vias may enable selective connectivity to components of the midplane board without custom connectors and/or contacts.

A substrate may have a void defined therethrough. A first contact may be received within the first void at one end, and a second contact may be received within the first void at the opposite end. The first contact may be associated with a first header connector, and the second contact may be associated with a second header connector. The first header connector may be orthogonal to the second header connector. The void may have an electrically conductive lining on its inner surface. The substrate may have an internal conductive path and/or layer. Backdrilling may remove a portion of the electrically conductive lining such that the electrically conductive lining and the first contact may be interference fit, and such that the electrically conductive lining does not electrically connect to the second contact, when inserted. Thus, the backdrilled via may connect the first contact and the conductive path, while the first contact and the second contact may be electrically isolated from each other.

BRIEF DESCRIPTION OF THE DRAWINGS

FIG. 4 depicts an example process for providing selective connectivity to a midplane board in a shared-via, orthogonal architecture.

DETAILED DESCRIPTION

Figure 1:
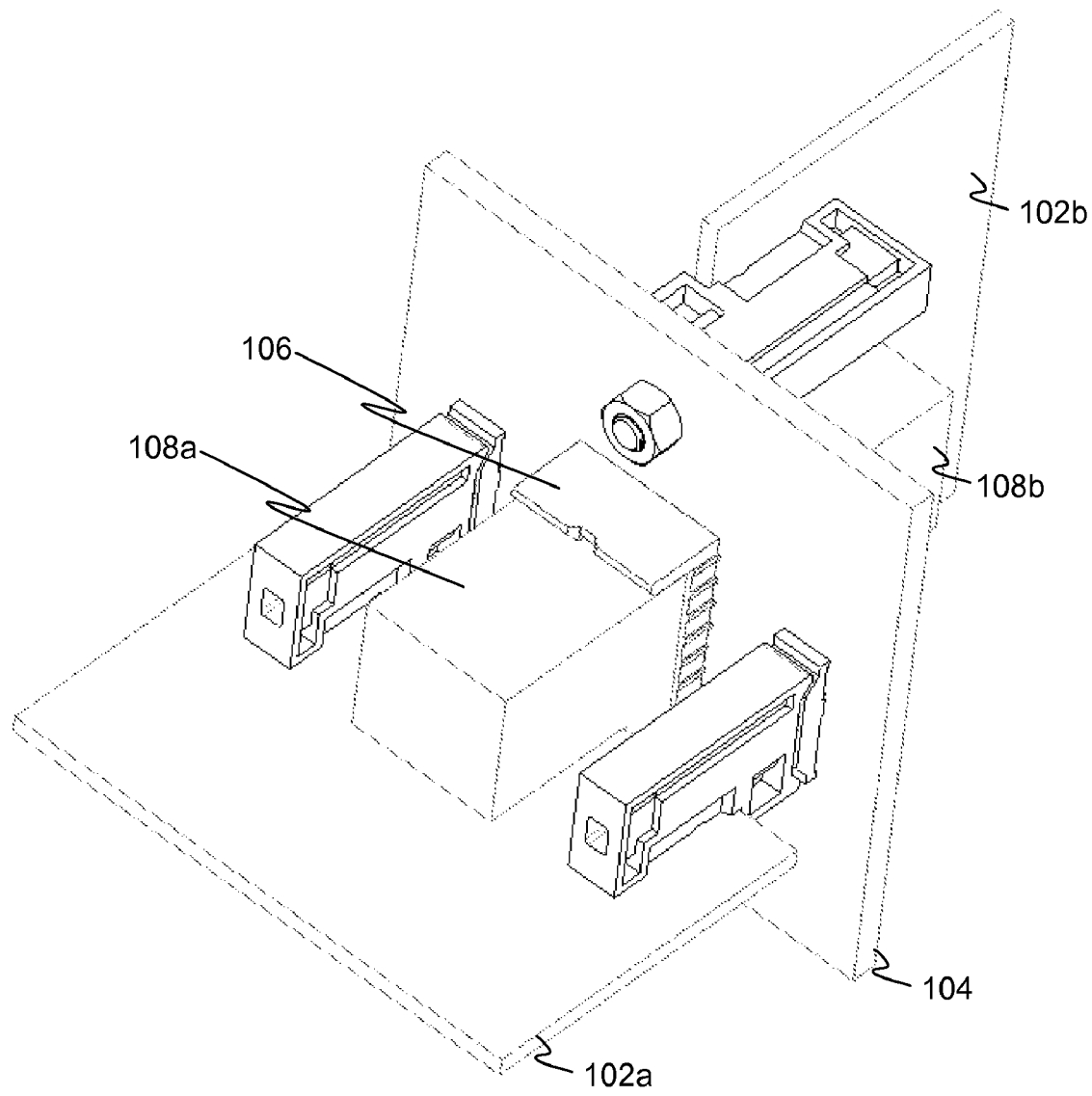
FIG. 1 depicts daughter boards orthogonally mated to a midplane board in an isometric view.

FIG. 1 depicts daughter boards 102*a-b* orthogonally mated to a midplane board 104 in an isometric view. The daughter boards 102*a-b* may be aligned orthogonally to each other and to the midplane board 104. One daughter board 102*a* may be aligned horizontally on one side of the midplane board 104 and the other daughter board 102*b* may be aligned vertically on the other side of the midplane board 104. The daughter boards 102*a-b* and the midplane board 104 may include a substrate and one or more electrically conductive traces and/or layers. For example, the daughter boards 102*a-b* and the midplane board 104 may include printed circuit boards, multilayer circuit boards, or the like.

Each daughter board 102*a-b* may be connected to the midplane board 104 by a respective electrical connector assembly. Each electrical connector assembly may include a header connector 106 (the header connector on the other side of the midplane board 104 is not shown) and a right angle connector 108*a-b*. The electrical connector assembly may include any style electrical connector suitable for electrically connecting a plurality of circuit boards. The connectors may be orthogonal style connectors, mezzanine style connectors, coplanar style connectors, or the like.

As illustrated in FIG. 1, the header connectors 106 may be oriented orthogonal to each other. The header connectors 106 may be positioned on opposite sides of the midplane board 104. Each header connector 106 may include a connector housing and one or more contacts. The header connector housings may have complementary formats with respect to each other. For example, the header connectors 106 may be from the same connector family. The header connectors 106 may have a common contact layout. The header connectors 106 may have a common format. For example, the header connectors 106 may be identical to each other. The header connectors 106 may be orthogonal to each other such that the contacts that correspond with each other may be in the same relative position within each respective connector housing. The connector housing may provide mating guidance complementary to that of the respective right angle connector 108*a-b*. The connector housing may be made of the dielectric material such as plastic, for example.

Each connector housing may secure and/or house one or more contacts. Each contact of the header connector 106 may have a respective mounting and a respective mating end. The mounting end may be suitable for mounting the header connector 106 to the midplane board 104. The mating end may be suitable for establishing a physical and/or electrical connection with a corresponding contact within the right-angle connector 108*a-b* to form a connector assembly. When the electrical connector assemblies are mated, the contacts may establish one or more electrically conductive paths from one daughter board 102*a* to the midplane board 104 and one or more electrically conductive paths from the midplane board 104 to the other daughter board 102b.

Within a connector housing, the one or more contacts may be formed within one or more Insert Molded Leadframe Assemblies (IMLAs). An IMLA may include a linear contact array. Each IMLA may include the one or more contacts secured by a dielectric body. In an embodiment, the contacts within an IMLA may be tightly electrically edged coupled. For example, the contacts within an IMLA may be rectangular in cross section and may be aligned edge-to-edge with or without a corresponding ground and/or reference plane. IMLAs may be used for single-ended signaling, differential signaling, or a combination of signal-ended signaling and differential signaling.

The right angled connectors 108a-b may include respective right-angle connector housings and right-angle contacts. The right angle connector housing may secure and/or house one or more right angle contacts. The right angle contacts may be formed within one or more right angle IMLAs. Each right angle contact may have a respective mounting and a respective mating end. The mounting end may be suitable for mounting the right angled contact to the daughter board 102a-b. The mating end may be suitable for establishing a physical and/or electrical connection with a corresponding contact within the header connector 106.

The header connectors 106 may be aligned with each other such that the mounting ends of some or all of the contacts are received by shared vias in the midplane 104. Each via may include a void or aperture that extends through the midplane board 104. Each void may have an inner surface that is plated with an electrically conductive lining. Thus, the electrical connector assemblies may establish one or more electrically conductive paths from one daughter board 102a to the other daughter board 102b, through one right angle connector 108a, the corresponding header connector 106, the midplane board 104, the other header connector (not shown), and the corresponding right angle connector 108b.

The midplane board 104 may have one or more electrically conductive layers and/or paths. An electrically conductive layer and/or path may be present at the surface of the substrate or between two dielectric layers. For example, the midplane board 104 may be a multilayer circuit board. The electrically conductive path may include one or more traces that define specific paths of conductive material. The electrically conductive path may electrically connect a via to another via and/or connect a via to another electrical component mounted on the midplane board 104. A via may run perpendicular to the electrically conductive layer. The via may serve as a path between electrically conductive layers and/or paths. The electrically conductive layers may include one or more reference layers (i.e., electrical ground layers). The electrical connector assemblies may establish an electrically conductive path from one daughter board to an electrically conductive layer of the midplane board 104 by way of the shared vias.

The disclosed shared-via architecture may enable selective contacts to be electrically connected through the vias of the midplane board 104 to corresponding contacts and other contacts to be electrically connected by way of the vias to a conductive layer and/or path within the midplane board 104. To illustrate, some contacts in a header connector 106 may be electrically connected through the midplane board 104 to corresponding contacts of the other header connector (not shown). Other contacts in a header connector 106 may be electrically connected to one or more conductive layers and/or paths within midplane board 104.

Using the disclosed shared-via architecture with backdrilled vias, an electrical system may be selectively designed such that some signals route through the midplane board 104 and other signals route to the midplane board 104, efficiently using the same connector without alteration.

In an example embodiment, contacts electrically connected through the midplane board 104 may provide high-speed signaling, and other contacts electrically connected to a conductive layer within the midplane board 104 may provide low-speed signaling, power, electrical ground control signaling, or the like.

Figure 2:
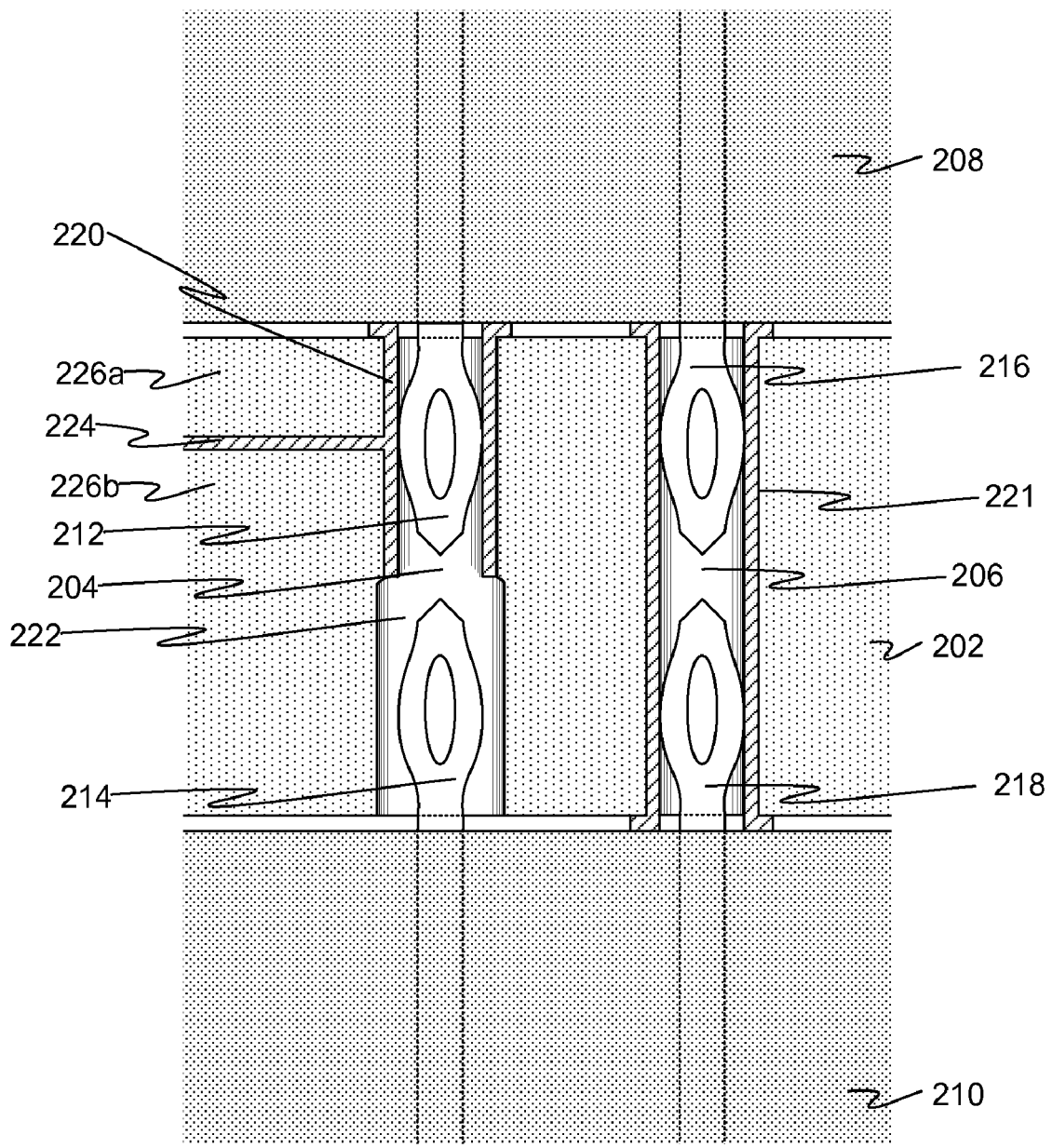
FIG. 2 depicts two adjacent shared vias, in a side view.

FIG. 2 depicts a side view of two adjacent shared vias, in cross section. The two adjacent, shared vias extend through the midplane board 202. A first header connector 208 and a second header connector 210 may be connected to either side of the midplane board 202. The first header connector 208 may include a first connector housing that secures a first mounting contact 212. The second header connector 210 may include a second connector housing that secures a second mounting contact 214. The first header connector 208 may include a third mounting contact 216 secured by the first connector housing. The second header connector 210 may include a fourth mounting contact 218 secured by the second connector housing.

Each contact may have a mounting end and a mating end (not shown). The contacts may be made of any electrically conductive material such as metal. Each contact's mounting end may be configured to establish a physical and/or electrical connection with the midplane board 202. The mounting end may include a press-fit tip, such as an eye-of-the-needle, for example or any surface mount. Each contact's mating end within the header connector may be configured to establish a physical and/or electrical connection with a corresponding contact in the right angle connector. For example, as shown in FIG. 1, the contact's mating end in the header connector 106 may be a blade, and the contact's mating end in the right-angled connector 108a-b may be a receptacle. The reverse is also contemplated.

The midplane board 202 may include one or more vias. A via may include a void extending through the midplane board 202. The void may include an internal surface. The internal surface of the void may be plated fully or partially with an electrically conductive material 220. A via may be connected to one or more electrically conductive layers and/or paths, such as conductive path 224, within the midplane board 202. The electrical conductive path 224 may be oriented between two dielectric layers 226a-b of the midplane board 202.

One or more vias may be backdrilled vias. Backdrilling is a process that removes the portion of the plating within the via. For example, the electrically conductive material lining 220 of the via may be removed by backdrilling. A cutting device, such as a drill, may be used to form an enlarged portion of the via. The cutting device may leave a portion of the plated via unchanged. The backdrilled portion 222 may have a diameter greater than that of the unchanged portion. The cutting device may be any size suitable for removing the plated conductive lining 220 of the via. For example, the cutting device may have a diameter approximately 0.35 mm greater than that of the diameter of the via. The cutting device may form a round hole, a square hole, and elliptical hole, or the like.

As illustrated in FIG. 2, a midplane board 202 may have a first via 204 and a second via 206. The first via 204 may be a backdrilled via. A first header connector 208 and the second header connector 210 may be mounted on opposite sides of the midplane board 202. A first mounting contact 212 may extend from the first header connector 208. A second mounting contact 214 may extend from the second header connector 210. The first mounting contact 212 and the second mounting contact 214 may be received in opposite ends of the first via 204.

A third mounting contact 216 may extend from the first header connector 208. A fourth mounting contact 218 may extend from the second header connector 210. The third mounting contact 216 and the fourth mounting contact 218 may be received in opposite ends of the second via 206.

The first mounting contact 212 may be press-fit against the conductive lining 220 of the first via 204. Depending on the diameter of the backdrilled portion 222, the second mounting contact 214 may have an air gap between the second mounting contact 214 and the inner surface of the backdrilled via 204. In the alternative, the second mounting contact 214 may be press-fit to the backdrilled wall of the via 204. Thus, the conductive lining 220 may extend from one side of the midplane board 202, along the inner surface of the first via 204, to a point between the first mounting contact 212 and the second mounting contact 214. For example, the conductive lining 220 may extend past the point at which it abuts the first contact 212 and before the point at which it would abut the second contact 214.

The first via 204 provides an electrically conductive path between the first mounting contact 212 and the conductive path 224 within the midplane board 202. Because the first via 204 has had a portion of the plating removed, the second mounting contact 214 may be electrically isolated from the first mounting contact 212. The second mounting contact 214 may be electrically isolated from the electrically conductive lining 220 of the via 204 and the internal conductive path 224 internal to the midplane board 202. The conductive path 224 may be between two other layers of the midplane board 202 substrate. For example, the conductive path 224 may be between two dielectric layers 226a-b.

The first mounting contact 212 may be used to provide communications and/or power between a daughter board and midplane board 202. For example, the first mounting contact 212 may be used for a low-speed communication channel. The second mounting contact 214 may be electrically connected to ground on the daughter board.

The second via 206, not having been backdrilled, may establish a conductive path from the third mounting contact 216 to the fourth mounting contact 218. The third and fourth mounting contacts 216, 218 may be electrically connected to a non-backdrilled conductive lining 221. The third and fourth mounting contacts 216, 218 may be used to provide communications between daughter boards. For example, the third and fourth mounting contacts 216, 218 may be used for high-speed communications between daughter boards. The third mounting contact 216 may be one part of a differential signaling pair of contacts. The non-backdrilled conductive lining 221 may be electrically isolated from the backdrilled conductive lining 220 and the conductive path 224. The third mounting contact 216 may be a ground contact.

Figure 3A:
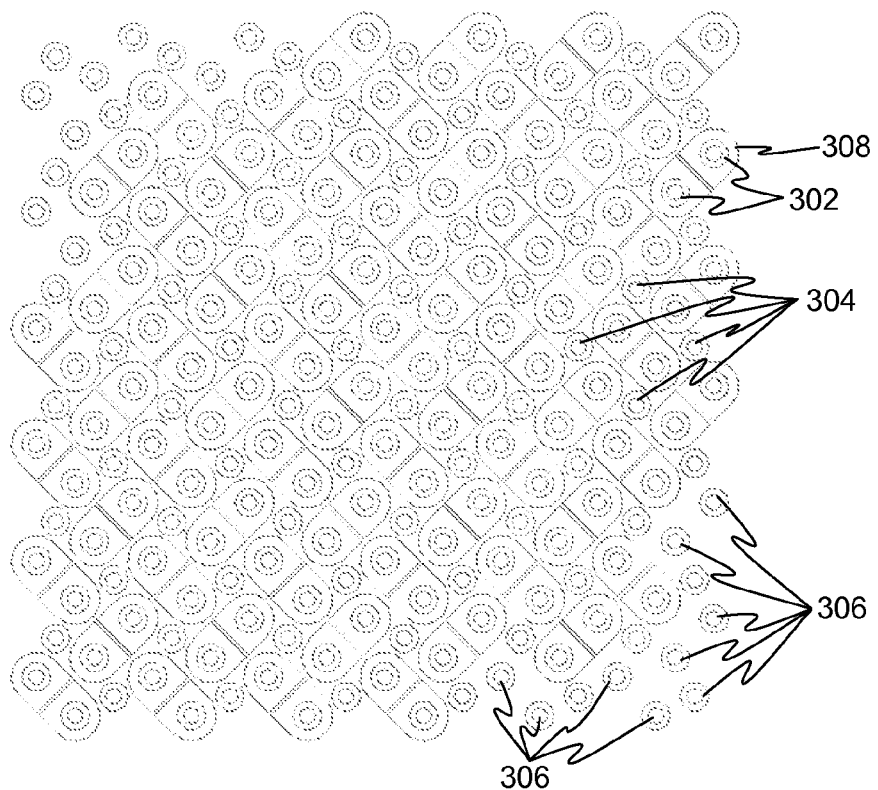
FIGS. 3A & 3B depict an example orthogonal footprint on a front side and a back side of a midplane, respectively.
Figure 3B:
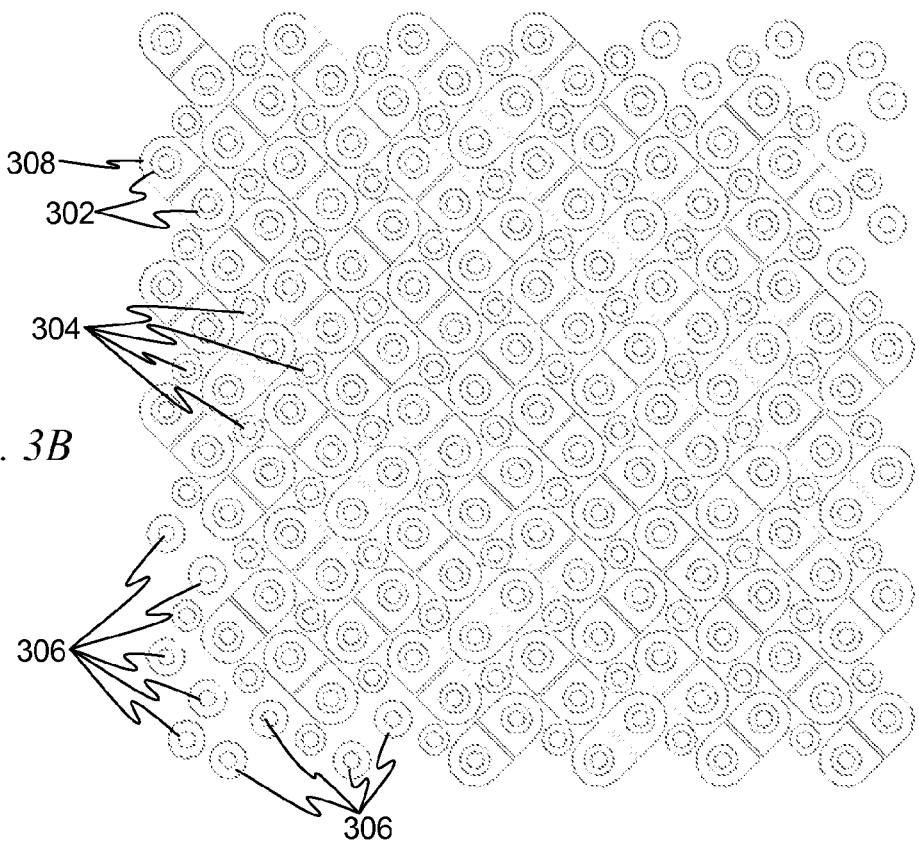

FIGS. 3A & 3B depict an example orthogonal footprint on a front side and a back side of a midplane board, respectively. The orthogonal footprint defines the layout of the vias for the midplane header connectors mounted to either side of the midplane board. The orthogonal footprint shown in FIG. 3A depicts the layout as viewed from one side of a midplane board, and the orthogonal footprint shown in FIG. 3B depicts the layout as viewed from the opposite side of the midplane board. The footprint may define a field of vias that include a plurality of signal pair vias 302, a plurality of ground vias 304, and a plurality backdrilled vias 306.

The signal pair vias 302 may be associated with differential signal pair contacts. The signal pair vias may provide an electrically conductivity through the midplane board between the header connectors. Each pair of signal pair vias 302 may be oriented in one of two directions. The two directions may be perpendicular to each other. Adjacent pairs of signal pair vias 302 may be oriented perpendicular to each other.

The footprint may define one or more anti-pads 308. Each anti-pad 308 may be associated with a pair of signal-pair vias 302. Each anti-pad 308 may represent an area of the midplane board where there is a opening in a ground layer. An anti-pad 308 may circumscribe signal-pair via 302.

The ground vias 304 may be adjacent to the signal pairs vias 302. Each pair of signal-pair vias 302 may have four adjacent ground vias 304. The ground vias 304 may provide electrical ground conductivity through the midplane board between the header connectors.

The backdrilled vias 306 may be vias that have been backdrilled, such that a portion of the conductive lining on the inner surface of the backdrilled via 306 has been removed. The backdrilled vias 306 may be associated with one or more conductive paths defined by the midplane board. For example, the midplane board may be a multilayer circuit board defining one or more internal conductive paths. One or more of the conductive paths may be electrically connected to one or more backdrilled vias 306. Each backdrilled via 306 and a corresponding conductive path may connect a daughter board to a component on the midplane. For example, the backdrilled vias 306 may be used to provide a link between a daughter board and the midplane board for low-speed communications channel, power, ground, control signaling, or the like.

Each backdrilled via 306 may be backdrilled from either side of the midplane board. The backdrilled vias 306 may provide any combination of connections from either daughter board to the midplane board. For example, all of the backdrilled vias 306 may be backdrilled from the same side of the midplane board, providing connections from one daughter board to the midplane board and no connections from the other daughter board to the midplane board. In an alternative example, some of the backdrilled vias 306 may be backdrilled from one side of the midplane and some backdrilled from the other side, providing some connections from one daughter board to the midplane board, and some connections from the other daughter board to the midplane board. Any combination of backdrilling from either side of the midplane board may be used.

The backdrilled vias 306 may be positioned anywhere in the field of vias defined by the footprint. For example, the backdrilled vias 306 may be positioned along the periphery of the field to provide adequate clearance for conductive paths extending from the backdrilled vias. Similarly, the signal-pair vias 302 and the ground vias 304 may be positioned within the interior of the field.

FIG. 4 depicts an example process for providing selective connectivity to a midplane board in a shared-via, orthogonal architecture. At step 402, an electrical connector footprint may be defined. The footprint may be an orthogonal, shared-via footprint. The footprint may indicate a location for a backdrilled via. For example, the location may be positioned along a periphery of the footprint.

At step 404, a first header connector and a second header connector may be provided. For example, the first header connector and the second header connector may be provided by a connector manufacturer, reseller, system integrator, or the like. The first header connector and the second header connector may correspond to the footprint. The first header connector and the second header connector may be part of a defined connector family. The first header connector may include a first mounting contact extending therefrom. A second header connector may include a second mounting contact extending therefrom.

The footprint may be provided by a connector manufacturer, reseller, system integrator, or the like. The footprint may be provided in a technical specification document, white paper, design application document, or the like. The footprint may be provided in a computer readable format. For example, the footprint may be provided electronically as a computer aided drafting (CAD) diagram, an image file, a portable document format, or the like.

At step 406, a substrate may be prepared consistent with the footprint. The substrate may have via holes drilled and plated. At step 408, the substrate may be backdrilled consistent with the footprint. For example, a via may be backdrilled in the location indicated by the footprint. The substrate may be backdrilled such that a portion of the via plating is removed and a portion of the via plating remains. The backdrilling may maintain connectivity between the portion of the via plating that remains and an internal conductive path and/or layer of the substrate. The depth of the backdrilling may be determined by the size of the mounting ends of the contacts of the first header connector and the second header connector.

At step 410, the first header connector and the second header connector may be mounted to the substrate having been prepared consistent with the footprint. The first header connector and the second header connector may be mounted to opposite sides of the substrate. The first header connector and the second header connector may be orthogonally oriented to each other when mounted to the substrate.

The first mounting contact of the first header connector may be inserted into the backdrilled via identified by the footprint. The second mounting contact of the second header connector may be inserted into an opposite end of the backdrilled via identified by the footprint. Consistent with the footprint, the backdrilled via may provide electrical conductivity between the first mounting contact and an internal conductive layer of substrate. Consistent with the footprint, the backdrilled via may establish an electrical isolation between the second contact and the first contact. Due to the backdrilling, the first contact may abut the plated portion of the backdrilled via and the second contact may have a physical gap between it and the plated portion. For example, the second contact may abut the inner surface of the via hole where the plating has been removed by backdrilling. Because the via hole may be wider in the area in which the plating has been removed by backdrilling, the second contact may stand alone within the via hole, not abutting the inner surface of the via.

The resulting circuit board may enable selective routing of electrically conductive paths from a contact to the midplane substrate, in an orthogonal system architecture. Such an electrically conductive path may be suitable for low-speed communications, power, electrical ground, control signaling, or the like. The electrically conductive path may be routed from one header connector, the other header connector, or a combination of both header connectors. The contact that shares a via with a contact being routed to the midplane substrate may be used as an electrical ground.

System designers of orthogonal architecture electrical systems may benefit from selectively being able to route paths to the midplane without having to use custom connectors. Paths may be routed to the midplane without having to use custom connectors with missing contacts, modified contacts (e.g., having a mounting portion removed), or additional connectors, separate from the orthogonal electrical connector assemblies.

What is claimed:

1. A system comprising:
   a substrate that defines a plurality of vias extending through the substrate, the vias arranged as an orthogonal, shared via footprint, and an electrical trace connected to at least one of the vias;
   a first electrical connector having a first plurality of electrical contacts extending into a first end of the corresponding plurality of vias, such that one of the first plurality of contacts extends into the at least one via and is electrically connected to the electrical trace; and
   a second electrical connector orthogonal to the first electrical connector, the second electrical connector having a second plurality of contacts extending into an second opposing end of the corresponding pluralities of vias, such that one of the second plurality of contacts extends into the at least one via and is electrically isolated from the electrically conductive trace.

2. The system of claim 1, wherein the at least one via includes electrically conductive lining connected to the electrical trace, and the one of the first plurality of contacts is connected to the electrically conductive lining.

3. The system of claim 2, wherein the substrate defines a first dielectric layer and a second dielectric layer, and wherein the electrically conductive trace is connected between the first dielectric layer and the second dielectric layer.

4. The system of claim 1, wherein at least one via is a backdrilled via hole.

5. The system of claim 2, wherein the electrically conductive lining extends from the first end towards the second end along an inner surface of the first via to a point after abutting the one of the first plurality of contacts and before abutting the one of the second plurality of contacts.

6. The system of claim 1, wherein the one of the first plurality of contacts is interference fit against the electrically conductive lining.

7. The system of claim 1, wherein the one of the second plurality of contacts is interference fit against an inner surface of the first void.

8. The system of claim 1, wherein the first electrical connector has a contact layout complementary to the second electrical connector.

9. The system of claim 1, wherein the substrate defines a second one of the vias having a second electrically conductive lining, wherein the first connector comprises a second one of the first plurality of contacts received in the second one of the vias and electrically connected to the second electrically conductive lining, and the second connector comprises a second one of the second plurality of contacts received in the second one of the vias and electrically connected to the second electrically conductive lining.

10. The system of claim 9, wherein the second ones of the first and second pluralities of contacts are each interference fit with the second electrically conductive lining.

11. The system of claim 1, wherein the one of the second plurality of contacts is electrically isolated from all other contacts.

12. A midplane system comprising:
   a substrate defining a plurality of vias extending through the substrate and arranged as an orthogonal shared via footprint, at least one of the vias being a backdrilled via;
   a first connector mounted to a first side of the substrate, wherein the first connector comprises a first contact that extends into the backdrilled via; and a second connector orthogonal to the first connector and mounted to a second side of the substrate, wherein the second connector comprises a second contact that extends into the backdrilled via, wherein the first contact is connected to an electrically conductive path of the substrate, and the second contact is electrically isolated from the first contact.

13. The system of claim 12, wherein the second contact is electrically isolated from all contacts of the first contact connector.

14. The system of claim 12, wherein the plurality of vias defines a field of vias, and the backdrilled via is disposed at a periphery of the field of vias.

15. A system comprising:

a substrate that defines a plurality of vias extending through the substrate, each via defining an internal void having a first end and an opposing second end, and the substrate further defining an electrically conductive member, wherein a first electrical connector carrying a first plurality of contacts is configured to be mounted onto one surface of the substrate such that the first plurality of contacts are configured to extend into the first ends of the plurality of vias, respectively, and one of the first plurality of contacts extends through a selected one of the vias and is electrically connected to the electrically conductive member; and a second electrical connector carrying a second plurality of contacts is configured to be mounted onto an opposing surface of the substrate such that the second plurality of contacts is configured to extend into the second ends of the plurality of vias, respectively, and one of the second plurality of contacts extends into the selected one of the vias and is electrically isolated from the electrically conductive member.

16. The system of claim 15, further comprising the first electrical connector and the second electrical connector.

17. The system of claim 15, wherein the electrically conductive member comprises an electrically conductive lining extending along the inner surface of the first end of the selected one of the vias, and the lining does not extend along the inner surface of the second end of the selected one of the vias.

18. The system of claim 15, further comprising an electrical trace extending along the substrate and electrically connected to the electrically conductive lining at one end, and configured for electrical connection to one of the second plurality of electrical contacts.

19. The system of claim 15, wherein the plurality of vias is arranged as an orthogonal shared footprint.

20. The system of claim 19, wherein the second electrical connector is configured to be mounted onto the substrate in an orthogonal relationship with respect to the first electrical connector.

21. The system of claim 15, wherein the second end of the selected one of the vias is backdrilled to produce a diameter of the second end that is greater than that of the first end.

22. The system of claim 15, wherein the one of the second plurality of contacts is electrically isolated from all other contacts.

* * * * *